United States Patent [19]

Sukumar

[11] Patent Number: 5,587,658
[45] Date of Patent: Dec. 24, 1996

[54] SHIMMING METHOD FOR NMR MAGNET USING UNSHIELDED GRADIENT SYSTEMS

[75] Inventor: Subramaniam Sukumar, Union City, Calif.

[73] Assignee: Bruker Instruments, Inc., Billerica, Mass.

[21] Appl. No.: 519,290

[22] Filed: Aug. 25, 1995

[51] Int. Cl.$^6$ .................................................. G01V 3/00
[52] U.S. Cl. ................................................ 324/309; 324/307
[58] Field of Search ................................ 324/300, 307, 324/309, 310, 311, 312, 313, 314, 318, 322

[56] References Cited

U.S. PATENT DOCUMENTS 5,055,789  10/1991  Kondo et al. .......................... 324/309

OTHER PUBLICATIONS

A. Manabe, *Multi–Angle Pojection Shim* (MAPshim): *In Vivo Shim Adjustment up to 2nd Order with 0.2 Second Sequence Time*, SMR Abstracts, pp. 1174, (1994), 2nd meeting (Society of Magnetic Resonance), Aug. 12, 1994.

Z. Lui et al., $^1$H_CSI *Automatic Shimming Procedure for Surface and Body Coils*, SMR Abstracts, pp. 1174, (1994), 2nd meeting (Society of Magnetic Resonance), Aug. 12, 1994.

I.S. MacKenzie et al., *A Simple Field Map for Shimming*, Magnetic Resonance In Medicine, vol. 5, pp. 262–268, 1987.

James Tropp et al., *Automated Shimming of $B_0$ for Spectoscopic Imaging*, Journal of Magnetic Resonance, vol. 85, pp. 244–254, 1989.

Peter Webb et al., *Rapid, Fully Automatic, Arbitrary–Volume in Vivo Shimming*, Magnetic Resonance In Medicine, vol. 20, pp. 113–122, 1991.

Rolf Gruetter et al., *Fast, Noniterative Shimming of Spatially Localized Signals. In Vivo Analysis of the Magnetic Field along Axes*, Journal Of Magnetic Resonance, vol. 96, pp. 323–334, 1992.

Erika Schneider et al., *Rapid in Vivo Proton Shimming*, Magnetic Resonance In Medicine, vol. 18, pp. 335–357, 1991.

Manfred G. Prammer, *A New Approach to Automatic Shimming*, Journal Of Magnetic Resonance, vol. 77, pp. 40–52, 1988.

*Primary Examiner*—Michael Tokar
*Attorney, Agent, or Firm*—Bookstein & Kudirka, P.C.

[57] ABSTRACT

An method for determining the inhomogeneities of the magnetic field of the magnet of an NMR system makes use of unshielded coils while minimizing the effect of eddy currents induced in the magnet components by the gradient fields. A first dataset is acquired by ramping the level of a gradient magnetic field to a maximum value and generating an RF pulse to excite the spins. After a delay time $t_1$, a single data point is sampled. While the spins are allowed to relax, the gradient field magnitude is changed to the next level. Another RF pulse is generated and, after time $t_1$, the next data point is sampled. This process continues until a first complete dataset is acquired. The next gradient function is then applied in a similar manner, and the data points sampled after an RF pulse and a delay time of $t_2$. During sampling of the second dataset, the gradient area for each spatial data point is equal to the gradient area for that spatial point during sampling of the first dataset. After the second dataset is acquired, a frequency distribution for the gradient direction is obtained using known techniques.

21 Claims, 3 Drawing Sheets

SHIMMING METHOD FOR NMR MAGNET USING UNSHIELDED GRADIENT SYSTEMS

BACKGROUND OF THE INVENTION

1. Field of the Invention

This invention is related to nuclear magnetic resonance (NMR) techniques and, more specifically, to shimming the magnet of an NMR system to compensate for inhomogeneities in the field of the magnet.

2. Description of Related Art

A homogeneous magnetic field is critical for NMR experiments. Imaging experiments such as gradient echo-based techniques, localized spectroscopy and echo-planar imaging are a few experiments that can fail if the homogeneity of the magnetic field within a sample being tested is poor. While spin-echo imaging is more tolerant of inhomogeneities, a homogeneous magnet will nonetheless give better results.

In conventional NMR systems, the field of the magnet is "shimmed" by locating "shim-field" coils at various positions relative to the field of the magnet. As appropriate currents are passed through the shim field coils, they produce characteristic fields which compensate for the inhomogeneities of the magnet. However, achieving the appropriate characteristic fields in the shim coils often requires adjusting the current through the coils manually. This procedure can be tedious and time-consuming. In high-resolution systems, it is not unusual to shim a magnet for hours, or even days, to achieve a certain homogeneity specification. This procedure can be automated by employing a simplex procedure, but that too can be time consuming, and may not always give the optimum results.

A more analytical solution to the problem is to determine the inhomogeneous field distribution of the magnet, and calculate the currents of the shim coils necessary to compensate for the inhomogeneities. The field of the magnet can be measured by using a small NMR probe which is moved through the magnetic field by a special mechanical device. However, this method is also time-consuming. Furthermore, the probe itself causes a distortion in the field, and the measurement does not correspond to the actual field that would influence a sample being tested.

A number of automated shimming procedures have been reported which make use of NMR imaging. These methods are beneficial because: 1) the field measurements are done while a sample of interest is present in the field of the magnet, and the field inhomogeneity seen by the sample is directly measured and compensated for; 2) knowing the field or frequency distribution within the sample allows the specification of an arbitrary shimming region of interest; 3) shim field maps are calibrated using the same measurement methods and, therefore, and misregistration in the image caused by misalignments, non-linearities and imperfections in the gradient or shim coils are self-compensated; and 4) the shimming procedures can be fully automated.

Three-dimensional (3D), two-dimensional (2D) and one-dimensional (1D) image-based autoshimming methods have been demonstrated in the past. The field-mapping techniques used involve imaging pulse sequences and therefore require special three-axis field gradient hardware for performing the imaging experiments in high resolution NMR spectrometers. The field mapping experiments are specially designed to measure small residual field inhomogeneities in the magnet.

One disadvantage of the field-mapping techniques of the past is that pulsed field gradients can induce eddy currents in the metal components of the magnet which result in additional, time-varying (eddy current) fields. Unless the residual fields caused by the eddy currents are kept to a negligible level, the shimming procedure will produce erroneous results. Shielded gradient coils have been used in the past which are specially designed to minimize eddy current effects by restricting the stray field to within the bore of the coils. However, in high-resolution applications, non-negligible eddy currents may be generated even when using shielded coils.

The actively-shielded gradient coils currently in existence for use with modern gradient-enhanced spectroscopy experiments are ideally suited for field mapping experiments. However, the current design of these gradient coils are such that they are an integral part of a particular radio frequency (RF) probe, which limits their use for shimming. Limited space in many existing narrow-bore, high-resolution magnets makes it impractical to design a single, universal gradient set that can be used with the various RF probes that are used in a spectrometer. Furthermore, installing gradients on each RF probe may not be a practical solution because of cost considerations.

All NMR spectrometers are equipped with a set of linear gradient coils (unshielded) positioned along the x, y and z axes, respectively. However, these coils are not suitable for existing imaging experiments involving pulsed field gradients, mainly because of the slow response (rise and fall) times of the coils, and the eddy currents which would be induced during the process.

SUMMARY OF THE INVENTION

The present invention overcomes the problems of eddy currents by controlling the switching of the gradient field. The method of the present invention may be used with any type of gradient coil, shielded or unshielded but, in the preferred embodiment, makes use of the unshielded linear shim coils of an NMR system. Because the magnitude of eddy currents induced in the magnet components is proportional to the rate of change of the gradient field, the magnitude of the gradient field is changed gradually enough that induced eddy currents are negligible.

In the preferred embodiment, the gradient field magnitude is gradually increased to a maximum desired magnitude. Once the gradient reaches the desired maximum value, an RF pulse is generated which is incident on the sample and excites the spins of the sample nuclei. Following a specified delay time, $t_1$, a single data point is sampled. The spins are then allowed to relax and, during this time, the gradient strength is changed gradually to the next desired gradient level. The magnitude change is gradual enough that the magnitude of any induced eddy current is negligible, that is, a field generated by any induced eddy current is below a minimum desired homogeneity of the magnet during the sampling time (i.e. between the RF pulse and the sampling of the data point). Another RF pulse is then generated to again excite the sample nuclei. The next data point is then sampled after the time period $t_1$, and the spins are again allowed to relax and the gradient strength again changed down. This process continues until all of the $t_1$ data points are collected.

After the collection of the $t_1$ data points, the next desired gradient pulse sequence is ramped up to its maximum value. An RF pulse is generated to excite the nuclei spins and, after a delay time, $t_2$, a single data point is sampled. The spins are then allowed to relax and the gradient strength is then changed to the next gradient level. Another RF pulse is then generated, and the next data point is sampled after the time delay $t_2$.

Once both data sets have been collected (i.e. for time delay $t_1$ and for time delay $t_2$), any one of a number of data processing techniques may be used to obtain the desired frequency distribution. In the preferred embodiment, a technique involving multiple 1D projections is used in which the phases of the datasets are unwrapped to prevent aliasing. The gradient strengths of the two gradient sequences are related by the relative time delays used. In particular, the area of each gradient is the same, such that, for a stepped gradient function which remains constant during each of the sampling time periods $t_1$ and $t_2$, the gradient functions $G_1(x,y,z)$ (corresponding to time delay $t_1$) and gradient function $G_2(x,y,z)$ (corresponding to time delay $t_2$) satisfy the relation:

$$G_2(x,y,z) = G_1(x,y,z) \cdot (t_1/t_2)$$

In this way the two datasets maintain the same spatial encoding. This relationship corresponds to the gradient function of the preferred embodiment, in which the gradient magnitude is ramped gradually from one temporarily constant gradient value to the next. However, a constant gradient level during data sampling is not necessary.

In an alternative embodiment, the gradient magnitudes change continuously as a function of time, and are represented as $G_1(t)$ and $G_2(t)$. Some examples of such gradient functions include a linear ramp function or a sinusoidal function. These functions are not stepped, but are changing continuously, even during the delay times $t_1$ and $t_2$, respectively. As with the ramping of the gradient levels for the stepped gradient functions, the rate of change of the gradient magnitude is gradual enough that any eddy currents induced in surrounding conductive materials are negligible during the sampling period between the RF pulse and the time at which the sample point is taken at either $t_1$ or $t_2$. The gradient area during the sampling time of $t_1$ is also kept equal to the gradient area during sampling time $t_2$ for each spatial point. This relationship may be expressed as:

$$\int_0^{t1} G_1(t)dt = \int_0^{t2} G_2(t)dt$$

By maintaining this relationship between the two gradient functions, the gradient areas for the two sampling times remain equal.

DETAILED DESCRIPTION OF A PREFERRED EMBODIMENT

Figure 1A:
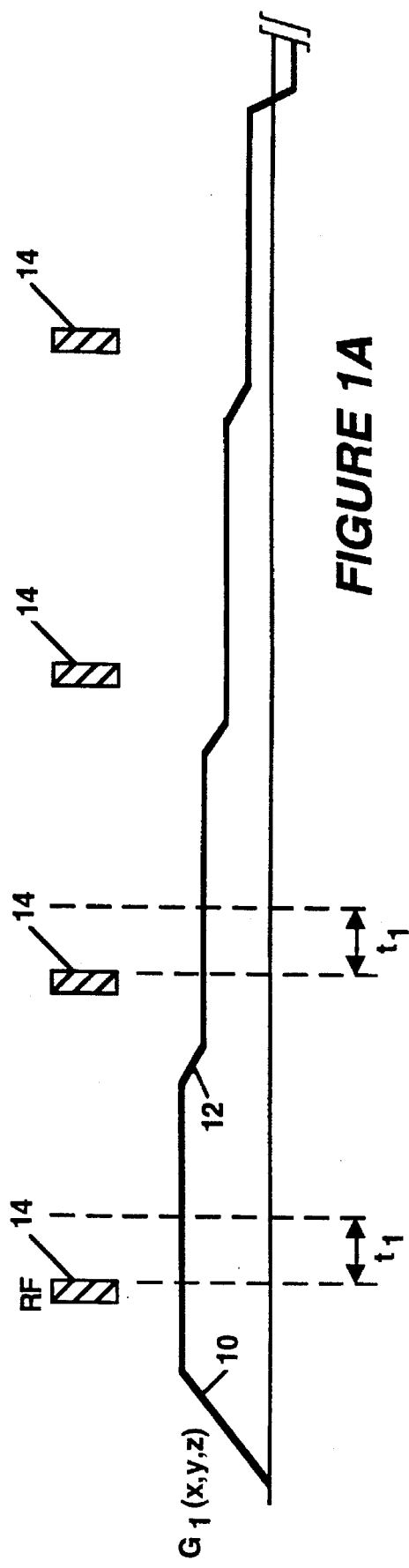
FIGS. 1A and 1B depict the gradient functions used for a first dataset and a second dataset, respectively, acquired with the method of the present invention.
Figure 1B:
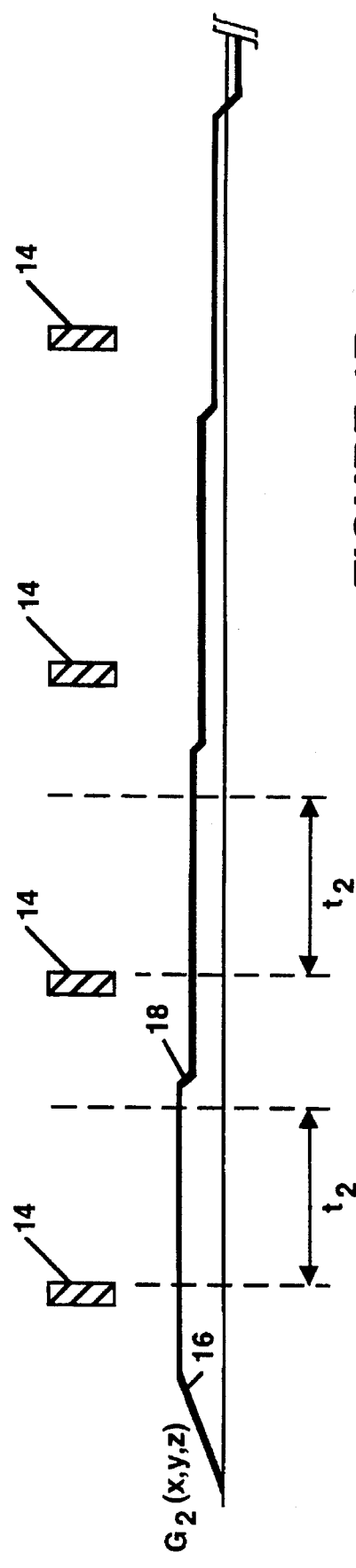

Depicted in FIGS. 1A and 1B are the gradient pulse sequences for an autoshimming method according to the present invention. In the preferred embodiment of the present invention, the desired gradient pulse sequences are generated using the linear X, Y and Z shim coils. Thus, the field generated by each of the shim coils is a combination of the necessary shim field for that direction, and the desired gradient field for that direction. However, those skilled in the art will recognize that the method of the present invention may be used with any coil which might be generating the gradient field. Since even shielded gradient field coils may generate non-negligible eddy currents under certain circumstances, the method of the present invention may be used when shielded coils are used as well.

Because the magnitude of eddy currents induced in the magnet are proportional to the rate of change of the gradient field, the gradient field $G_1(x,y,z)$ for the pulse sequence of FIG. 1A is ramped up slowly at the beginning of the experiment, as shown in section 10 of the gradient curve. This slow ramping of the gradient voltage minimizes the eddy current generation during the increase in the gradient voltage. Once the gradient voltage has reached a maximum gradient value, an RF pulse 14 is generated which excites the spins of the sample. This pulse is usually set to a small flip angle so that the sequence can be repeated rapidly.

Referring to FIG. 1A, after the RF pulse 14, a first data point is sampled at time $t_1$. The delay time $t_1$ is the phase encoding time. The spins are then allowed to relax before the next RF pulse 14 is applied. During this relaxation time, the gradient is changed to the next phase encoding value gradually (i.e. is ramped down along section 12 of the gradient curve of FIG. 1A). In this way the eddy current effects are minimized. Another RF pulse 14 is then generated to excite the spins at the next gradient level. The next data point is then sampled. This process continues until all of the data points for the first gradient are sampled.

The gradual ramping of the gradient field magnitude prevents non-negligible eddy current from being induced in surrounding conductive materials, particularly the metal portions of the NMR magnet. What constitutes "non-negligible" for a particular experiment depends on a number of variables, including the strength of the magnet fields being used, the structure of the magnet, and the desired sensitivity or resolution of the experiment. In general, however, the ramping (or slew rate) of the gradient field magnitude from one gradient level to the next should be sufficiently gradual that any fields resulting from induced eddy currents are below a minimum desired resolution (for shimming, below a minimum desired magnetic field homogeneity) during the sampling period between the RF pulse and the time at which the NMR signal is sampled at time $t_1$, so that the results of the experiment are unaffected by the eddys.

The image which is obtained at time $t_1$ is independent of the effects of magnet inhomogeneity. In order to generate the desired field maps, the inhomogeneity information must be encoded into the image data. This is done by initiating another gradient sequence having sampling at a time $t_2$, as shown in FIG. 1B.

The gradient of FIG. 1B is similar to that of 1A in that the signal is ramped up to the initial maximum gradient value, as shown in section 16 of the gradient curve. While the gradient level and the data acquisition time is different than in the data acquisition of FIG. 1A, the values are selected so that, if the gradient strength is lower, the data acquisition time is longer. That is, the gradient areas during $t_1$ and $t_2$ are kept equal, as is discussed in more detail below. The manner of data acquisition for the gradient of FIG. 1B, however, is essentially the same as that of the gradient shown in FIG. 1A. An RF pulse 14 is generated for each gradient strength to excite the spins, and the gradient strength is reduced gradually, as shown in the portion 18 of the gradient curve of FIG. 1B.

As mentioned above, it is important to maintain the same spatial encoding (field of view) in the second data collection as existed in the first data collection. For this reason, the gradient strength during the second data collection is selected such that:

$$G_2(x,y,z) = G_1(x,y,z) \cdot t_1/t_2$$

In other words, the area, $G_1(x,y,z) \cdot t_1$, of each step of the first gradient equals the area, $G(x,y,z) \cdot t_2$, of each corresponding step of the second gradient. By maintaining this relationship between the two data collections, the same spatial profile will be maintained between the two and, if Fourier transformed, they will have the same spatial image profile.

In the preferred embodiment, the gradient field is started at a maximum level, and ramped down step by step to a minimum value. In this way, a continuous set of data points is acquired, while minimizing the necessary change in magnitude of the gradient field from one data point to the next. It would be equally efficient to start the gradient at a minimum level (typically a negative value), and ramp it up step by step, acquiring a new data point while the gradient magnitude is temporarily constant at each step. However, it should be noted that other gradient sequences may also be used, provided the ramping from one gradient level to the next is gradual enough to keep the eddy currents to a negligible level.

In the broadest sense of the invention, the gradient magnitude need not be stepped from level to level, but may be change according to any function, provided the changes are gradual enough to avoid the induction of eddy currents which cause non-negligible magnetic fields during the sampling periods. It should be noted that non-negligible eddy currents may be generated, as long as non-negligible fields resulting therefrom are not present during the sampling periods. In other words, if a non-negligible eddy current-induced field decays to a negligible level before the end of the RF pulse, the effect of that field on the data sampling is negligible.

As an example of different possible gradient functions, an alternative embodiment uses a gradient field in which the gradient magnitude is not stepped from level to level, but is a continuously changing linear function which ramps over time from either a maximum value to a minimum value, or from a minimum value to a maximum value. As in the ramped portions of the stepped gradient, the slew rate of the ramping is gradual enough that any fields generated by induced eddy currents are negligible during the sampling period. As with the embodiment of FIGS. 1A and 1B, however, the gradient areas for $t_1$ and $t_2$ are still kept equal for each spatial point. This is accomplished by preserving the following relationship for each spatial point of the sample:

$$\int_0^{t1} G_1(t)dt = \int_0^{t2} G_2(t)dt$$

This ensures that the gradient area for each of the sampling times $t_1$ and $t_2$ remains equal.

The result of the method of the present invention is two image datasets which are essentially equivalent to the datasets that are collected at the two echo times in a 1D echo-based shimming method. The available subsequent data processing and the shimming protocols are also similar. For example, one such protocol is described in a co-pending patent application entitled "SHIMMING METHOD FOR NMR MAGNET HAVING LARGE MAGNETIC FIELD INHOMOGENEITIES," which may be identified by Bookstein & Kudirka, P.C. Attorney Docket No. B0002/7029 and which is assigned to the assignee of the present invention. In that application is described, in detail, a shimming procedure using a plurality of 1D images, as summarized below.

Figure 2:
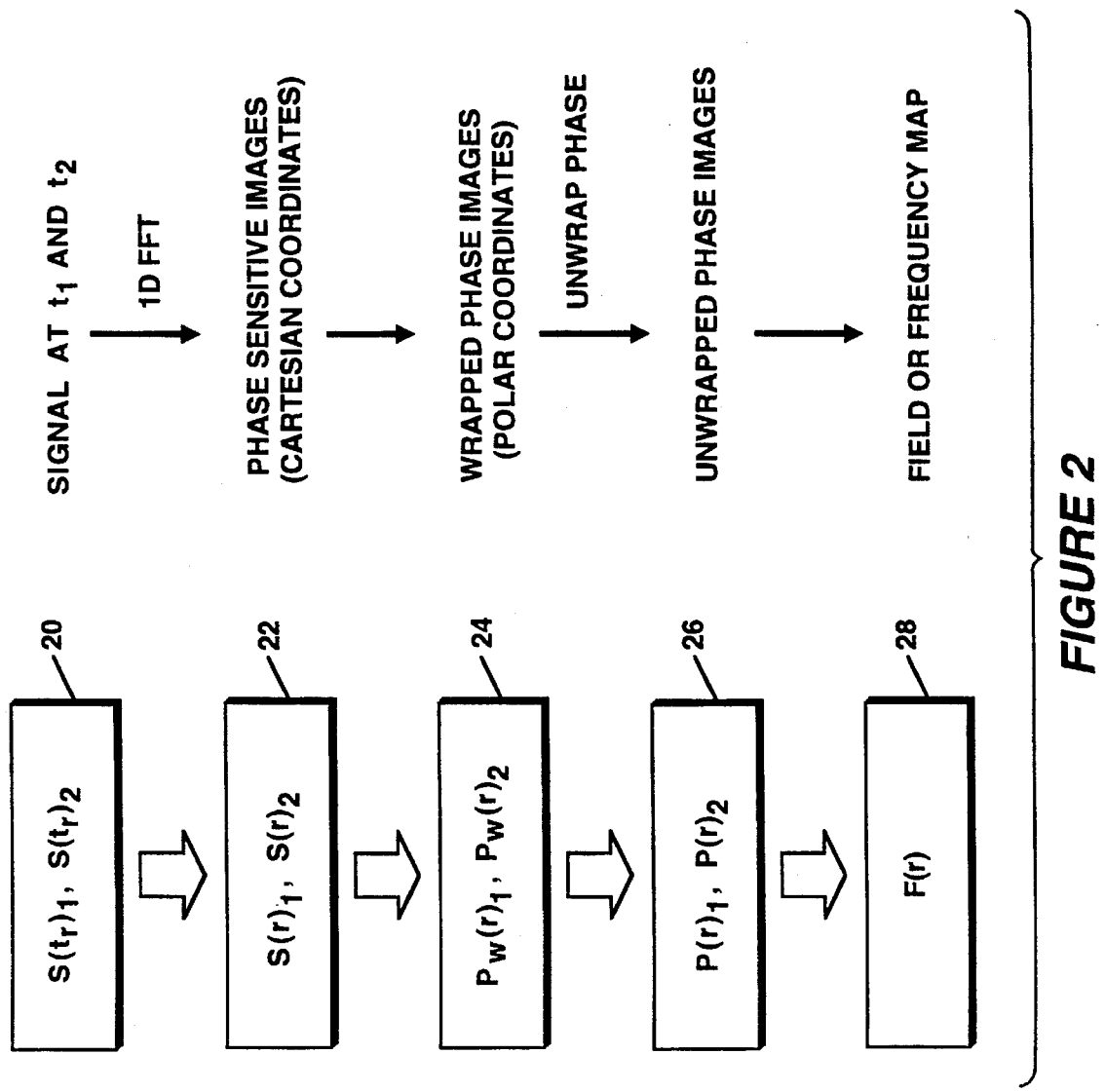
FIG. 2 is a diagram showing the sequence of steps in acquiring the desired frequency map from the sampled datasets of the present invention.

A plurality of projections are taken through the sample volume, with a data collection method as described above being used for each projection. For each of the projections, the desired data points (i.e. the frequency distributions), relative to the time delays $t_1$ and $t_2$ are collected. The data is then processed as shown in the diagram of FIG. 2.

After acquisition of the time-domain signals $s(t_r)_1$ and $s(t_r)_2$ (step 20), the signals are converted to the frequency domain by a 1D Fourier (typically fast Fourier) transform (step 22). The resulting phase sensitive images, $s(r)_1$, $s(r)_2$, which are in Cartesian coordinates, are then converted to polar coordinate signals, where $P_w(r)_1$ and $P_w(r)_2$ refer to the phase component (step 24). These phase images, which may suffer from phase wrapping, or "aliasing", are then "unwrapped" to remove discontinuities in the phase signals and obtain phase unwrapped signals $P(r)_1$ and $P(r)_2$ (step 26). The frequency distribution for this projection is then obtained by calculating:

$$F(r) = (P(r)_2 - P(r)_1)/(t_2 - t_1) \qquad \text{(step 28)}$$

Once a frequency distribution for each of the desired projection directions is acquired, the base field map is assembled. In an alternative form of this method the phase difference $P(r)_1 - P(r)_2$ may be acquired before the phase unwrapping is performed, after which the frequency is obtained by dividing by the time difference $t_2 - t_1$.

A shim-base field map may be acquired for each of the shim coils by energizing a subject coil with a predetermined current, and repeating the field measurement method described above. This measurement method is performed for each of the shim coils so that a plurality of shim-base field maps are acquired, each of which is indicative of the frequency distribution due to the field of the subject shim coil in combination with the inhomogeneities of the field of the magnet. Each shim field map is then obtained by subtracting the base field map from the shim-base field map, such that the remaining frequency distribution is due only to the effects of the subject shim coil.

Figure 3:
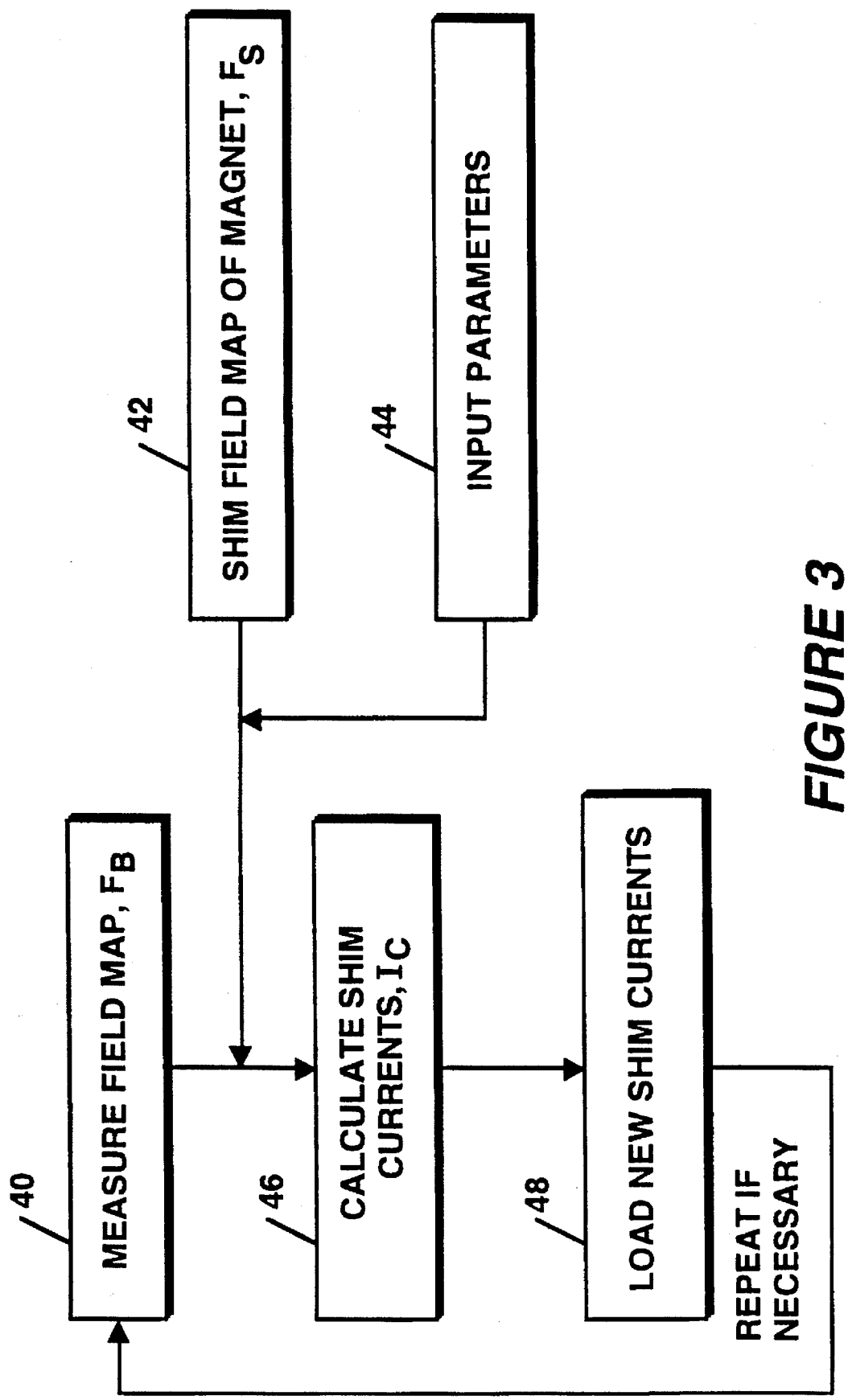
FIG. 3 is a diagram showing the sequence of steps for obtaining the optimum shim currents for shimming an NMR magnet using the frequency maps acquired with the method of the present invention.

The calculation of the appropriate shim currents is the done by relating the shim field maps and the base field map. The steps of this shimming procedure are shown in FIG. 3. The measured base field map, $F_B$, 40 is combined with the shim field map $F_S$, 42 (and appropriate input parameters 44 not particular to the present invention) and used to calculate the appropriate shim currents (step 46). These currents are calculated using an available algorithm (such as the function "SVDCMP" described in Section 2.6 of W. H. Press, et al., *Numerical Recipes in C*, Cambridge University Press) to perform a "Singular Value Decomposition" and acquire an optimum set of shim currents. The shim currents are then loaded (step 48), and the calculation repeated, if necessary. As shown in FIG. 3, multiple iterations of the data processing steps may be used to further optimize the shim currents.

The image-based autoshimming method of the present invention makes use of the linear shim coils for performing the experiments. The gradient fields are specially designed to minimize eddy current effects, and to encode the field inhomogeneity information for mapping the field. The use of the readily available X, Y and Z shim coils for field mapping has a number of advantages. Some of these advantages are described below.

Since all spectrometers are equipped with linear X, Y and Z shim coils, the image based shimming procedure can be easily implemented without the need for special (e.g., actively shielded) gradient coils and associated hardware, which tend to be expensive. The method can be implemented on a spectrometer so that multiple probes can be shimmed using a common shimming procedure and hardware. The shim field map only needs to be measured once, with just a single field map being necessary for the shimming process. Because there are only a few standard shim coil designs, the shimming procedure can be easily standardized. For example, it may be possible to use a common shim reference field map for a given type of shim coil/amplifier configuration, thereby simplifying the installation or testing of NMR systems and probes.

Because the shim coils are unshielded, the danger of eddy currents, which can be disastrous to field map experiments, always exists. However, the present invention avoids the rapid switching of the gradient fields, and thereby avoids this danger. Scan times in the present invention may be minimized by restricting the field maps to 1D or a set of 1D projections, as opposed to a complete 3D field mapping. In general, the present invention provides a cost savings and ease of implementation with existing current NMR spectrometers.

While the invention has been shown and described with reference to a preferred embodiment thereof, it will be understood by those skilled in the art that various changes in form and detail may be made herein without departing from the spirit and scope of the invention as defined by the appended claims.

What is claimed is:

1. A method of detecting a nuclear magnetic resonance (NMR) signal from each of a plurality of spatial points in a sample along a first direction, the method comprising the steps of:

A) locating the sample in a static magnetic field and applying a gradient magnetic field to the sample in the first direction;

B) applying a first radio frequency (RF) pulse to the sample;

C) detecting, after a predetermined duration of time $t_1$ following application of the first RF pulse, an NMR signal from the sample;

D) changing the magnitude of the gradient magnetic field at a rate which is sufficiently gradual that any eddy current induced in surrounding conductive materials as a result of the changing gradient magnetic field is small enough that any corresponding magnetic field generated by the eddy current is below a desired homogeneity of the static magnetic field;

E) applying a second RF pulse to the sample; and

F) detecting, after a duration equal to $t_1$ following application of the second RF pulse, an NMR signal from the sample.

2. A method according to claim 1 further comprising:

G) for each of a plurality of additional spatial points in the sample, 1) changing the gradient magnetic field at a rate which is sufficiently gradual that any eddy current induced in surrounding conductive materials as a result of the changing gradient magnetic field is small enough that any corresponding magnetic field generated by the eddy current is below a desired homogeneity of the static magnetic field, 2) applying an RF pulse to the sample, and 3) detecting, after a duration of $t_1$, an NMR signal from the sample.

3. A method according to claim 2 wherein, for each of the detected NMR signals, each change of the magnitude of the gradient magnetic field described in step G is a magnitude decrease.

4. A method according to claim 2 wherein, for each of the detected NMR signals, each change of the magnitude of the gradient magnetic field described in step G is a magnitude increase.

5. A method according to claim 1 wherein each occurance of changing the magnitude of the gradient magnetic field comprises changing the gradient magnetic field magnitude from one temporarily constant magnitude to another.

6. A method according to claim 1 wherein the gradient magnetic field is a first gradient magnetic field, and the method is a method for obtaining each of two sets of NMR signals at said plurality of spatial points in the sample, and further comprises the steps of:

G) applying a second gradient magnetic field to the sample in the first direction;

H) applying a first new RF pulse to the sample;

I) detecting, after a predetermined duration of time $t_2$ following application of the first new RF pulse, an NMR signal from the sample;

J) changing the magnitude of the second gradient magnetic field at a rate which is sufficiently gradual that any eddy current induced in surrounding conductive materials as a result of the changing second gradient magnetic field is small enough that any corresponding magnetic field generated by the eddy current is below a desired homogeneity of the static magnetic field;

K) applying a second new RF pulse to the sample;

L) detecting, after a duration of $t_2$ following application of the second new RF pulse, an NMR signal from the sample.

7. A method according to claim 6 wherein changing the magnitude of the first gradient magnetic field and changing the magnitude of the second gradient magnetic field each comprise changing the respective gradient magnetic field in such a way that, for each of the spatial points and each of the time durations $t_1$ and $t_2$, the first gradient magnetic field, $G_1(t)$, and the second gradient magnetic field, $G_2(t)$, satisfy the relationship $\int_0^{t_1} G_1(t)dt = \int_0^{t_2} G_2(t)dt$.

8. A method according to claim 6 wherein each occurance of changing the magnitude of the first gradient magnetic field and changing the magnitude of the second gradient magnetic field comprises ramping the gradient magnitude from one temporarily constant magnitude to another, said temporarily constant magnitudes being constant during respective time durations $t_1$ and $t_2$, and wherein for each of said spatial points in the sample, the magnitude of the first gradient field, $G_1(x,y,z)$, the magnitude of the second gradient field, $G_2(x,y,z)$, and the time delays $t_1$ and $t_2$, are selected such that for any particular spatial point, $G_2(x,y,z) \cdot t_2 = G_1(x,y,z) \cdot t_1$.

9. A method according to claim 6 wherein the NMR signals detected after said duration of $t_1$ following the application of an RF pulse are part of a first dataset from the sample, and the NMR signals detected after said duration of $t_2$ following the application of an RF pulse are part of a second dataset from the sample, and wherein the method further comprises determining a one-dimensional image of the sample in the first direction by comparing the NMR signals of the first dataset to the NMR signals of the second dataset.

10. A method according to claim 9 wherein comparing the NMR signals of the first dataset to the NMR signals of the second dataset comprises determining a phase of each detected NMR signal and, for each of the spatial points, taking the difference in phase between the NMR signal for that spatial point from the first dataset and the NMR signal for that spatial point from the second dataset, and dividing said phase difference by the difference between $t_2$ and $t_1$, so as to acquire a frequency distribution indicative of the NMR precession frequencies at each of said spatial points.

11. A method according to claim 10 wherein the method comprises a method of calculating the shim currents for a plurality of shim coils used to compensate for inhomogeneities in the magnetic field of an NMR magnet which is incident on the sample, and the method further comprises:

determining base NMR precession frequencies at the spatial points when only nominal currents are passed through the shim coils;

for each of the shim coils, passing a predetermined current through that particular shim coil and determining NMR precession freqencies at the spatial points, and subtracting from them the base NMR precession frequencies so as to obtain a shim frequency distribution due solely to the effects of that particular shim coil; and comparing the shim frequency distributions to the base frequency distribution to determine optimum shim currents to compensate for the inhomogeneities.

12. A method according to claim 11 where the step of comparing the shim frequency distributions to the base frequency distribution comprises placing the shim frequency distributions in a matrix A, placing the base frequency map in a column vector b, and finding a vector v which minimizes the value of $(A \cdot v - b)^2$, the minimizing vector v indicating said optimum shim currents.

13. A method according to claim 11 further comprising generating said gradient fields with unshielded gradient coils.

14. A method according to claim 11 further comprising generating said gradient field with said shim coils.

15. A method according to claim 14 wherein said shim coils are unshielded coils.

16. A method of acquiring an NMR frequency distribution for a predetermined direction through a sample material, the method comprising the steps of:

A) locating the sample in a static magnetic field and applying a first gradient magnetic field to the sample in the predetermined direction;

B) applying a radio frequency (RF) pulse to the sample;

C) detecting, a predetermined duration of time $t_1$ after application of the RF pulse, an NMR signal from the sample;

D) changing the magnitude of the first gradient field at a rate which is sufficiently gradual that any eddy current induced in surrounding conductive material as a result of the changing first gradient magnetic field is small enough that any corresponding magnetic field generated by the eddy current is below a desired homogeneity of the static magnetic field;

E) repeating each of steps B), C) and D) a predetermined number of times so as to assemble a first set of NMR signal data points;

F) applying a second gradient magnetic field to the sample in the predetermined direction;

G) applying an RF pulse to the sample;

H) detecting, a predetermined duration of time $t_2$ after application of the RF pulse, an NMR signal from the sample;

I) changing the magnitude of the second gradient field at a rate which is sufficiently gradual that any eddy current induced in surrounding conductive material as a result of the changing second gradient magnetic field is small enough that any corresponding magnetic field generated by the eddy current is below a desired homogeneity of the static magnetic field;

J) repeating each of steps G), H) and I) a predetermined number of times so as to assemble a second set of NMR signal data points; and K) comparing the first set of NMR signal data points and the second set of NMR signal data points with respect to the values of $t_1$ and $t_2$ to obtain said NMR frequency distribution.

17. A method according to claim 16 wherein changing the magnitude of the first gradient magnetic field and changing the magnitude of the second gradient magnetic field each comprise changing the respective gradient magnetic field in such a way that, for each of the spatial points and each of the time durations $t_1$ and $t_2$, the first gradient magnetic field, $G_1(t)$, and the second gradient magnetic field, $G_2(t)$, satisfy the relationship $\int_0^{t_1} G_1(t)dt = \int_0^{t_2} G_2(t)dt$.

18. A method according to claim 16 wherein each occurance of changing the first gradient magnetic field and each occurance of changing the second gradient magnetic field comprises changing the respective gradient magnitude from one temporarily constant magnitude to another, said temporarily being constant magnitudes being constant during respective time durations $t_1$ and $t_2$, and wherein for each of said spatial points in the sample, the magnitude of the first gradient field, $G_1(x,y,z)$, the magnitude of the second gradient field, $G_2(x,y,z)$, and the time delays $t_1$ and $t_2$ are selected such that for any particular spatial point, $G_2(x,y,z) \cdot t_2 = G_1(x,y,z) \cdot t_1$.

19. A method according to claim 16 further comprising:

L) collecting a plurality of NMR frequency distributions through the sample material by repeating steps A) through K) for each of a plurality of gradient directions.

20. A method according to claim 16 wherein the method is also a method for determining the optimum shim currents for a plurality of shim coils to generate shim fields which compensate for inhomogeneities in an NMR magnet, and the method further comprises:

M) assembling said NMR frequency distributions into a base frequency map;

N) for each of the shim coils, passing a predetermined current through the coil and collecting a plurality of NMR shim-base frequency distributions through the sample material by performing steps A) through K) for each of said plurality of gradient directions, wherein the spatial points for each shim frequency distribution of each shim coil corresponds spatially to one of the spatial points of the base frequency map, and wherein all of the shim frequency distributions for a particular shim coil are assembled into a shim-base frequency map for that particular shim coil;

O) subtracting the base frequency map from each of the shim-base frequency maps to obtain a plurality of shim frequency maps;

P) comparing the shim frequency maps to the base frequency map to determine said optimum shim currents.

21. A method according to claim 20 wherein step P) comprises placing the shim frequency map in a matrix A, placing the base frequency map in a column vector b, and finding a vector v which minimizes the value of $(A \cdot v - b)^2$, the vector v indicating the optimum shim currents.

* * * * *